United States Patent [19]

Gonzales

[11] Patent Number: 5,471,601
[45] Date of Patent: Nov. 28, 1995

[54] MEMORY DEVICE AND METHOD FOR AVOIDING LIVE LOCK OF A DRAM WITH CACHE

[75] Inventor: Mark A. Gonzales, Portland, Oreg.

[73] Assignee: Intel Corporation, Santa Clara, Calif.

[21] Appl. No.: 900,180

[22] Filed: Jun. 17, 1992

[51] Int. Cl.[6] ............................................. G06F 13/14
[52] U.S. Cl. .................. 395/403; 395/485; 395/728; 395/445; 364/DIG. 1; 364/240.9; 364/243.41; 364/259.2; 364/937; 364/246.91; 364/964.2; 364/964.9; 365/222
[58] Field of Search ..................................... 395/425, 725, 395/325; 365/222

[56] References Cited

U.S. PATENT DOCUMENTS

| | | | |
|---|---|---|---|
| 4,426,681 | 1/1984 | Bacot et al. | 395/425 |
| 5,101,479 | 3/1992 | Baker et al. | 395/325 |
| 5,113,514 | 5/1992 | Albonesi et al. | 395/425 |
| 5,133,074 | 7/1992 | Chou | 395/725 |

*Primary Examiner*—Glenn Gossage
*Attorney, Agent, or Firm*—Blakely, Sokoloff, Taylor & Zafman

[57] ABSTRACT

A method and apparatus for allowing two or more masters, such as central processing units (CPUs), to read a dynamic random access memory (DRAM) device which includes a cache connected to a main memory block. When a CPU provides a read request, the DRAM has a first logic circuit that compares addresses requested with addresses stored in the cache. If the addresses are the same, the DRAM sends an acknowledge (ACK) signal to that CPU and sends the data to the processor. If the addresses are not the same, the DRAM sends a no acknowledge (NACK) signal to the CPU and transfers the requested data from the main memory block to the cache. The DRAM has a second logic circuit that contains a latch which is set when the DRAM sends a NACK signal and reset when the DRAM sends a subsequent ACK signal. The second logic circuit is connected to the first logic circuit to disable the first logic circuit and prevent a cache fetch from main memory when the latch has been set. The second logic circuit is also connected to a refresh controller of the DRAM to prevent a refresh cycle when the latch is set. Both the first logic circuit and the refresh controller are enabled when the latch is reset.

7 Claims, 1 Drawing Sheet

MEMORY DEVICE AND METHOD FOR AVOIDING LIVE LOCK OF A DRAM WITH CACHE

BACKGROUND OF THE INVENTION

1. Field of the Invention

The present invention relates to a method and apparatus for preventing "livelock" between two masters that read information from a memory device containing cache.

2. Description of Related Art

Computers typically use dynamic random access memory (DRAM) devices to provide memory locations for the central processing unit (CPU). Increases in CPU size and speed have created a similar expansion in DRAM design. Unfortunately, increasing the size of a DRAM chip decreases the speed of memory access. Recently there has been incorporated into DRAM memory devices a cache line that provides a readily accessible block of data. Such a device is presently produced by Rambus, Inc. of Mountain View, Calif. The Rambus design incorporates a pair of caches that each store a row of data from a corresponding main memory block.

The CPU normally sends a read request that includes addresses. The DRAMs contain a control circuit that determines whether the cache has the requested data. If the cache has the data requested, the DRAM provides an acknowledge (ACK) signal to the CPU and the data is provided to the processor. If the cache does not have the data, the DRAM sends a no acknowledge (NACK) signal to the CPU and loads the requested data from main memory into cache. The processor then resubmits another read request package containing the same addresses. The cache will now have the requested data and will transfer the same to the CPU.

Attaching two masters (CPU's) to a DRAM with cache presents particular problems. For example, when the first CPU requests addresses that are not in the DRAM cache, the DRAM will NACK the request (generate a NACK signal) and then fetch the requested data from the main memory block and load the same into cache. The requested data is now in cache waiting for the first CPU to resubmit the same address request. If the second CPU provides a read request to the DRAM before the first CPU resubmits the first request, the DRAM will look to see if the cache contains the data requested by the second CPU. If the requested addresses are not within cache, the DRAM will generate a NACK signal and then proceed to fetch the new data from main memory and load the same into cache, replacing the data requested by the first CPU with the data requested by the second CPU. Now, when the first CPU again resubmits the same read request, the cache will not contain the data requested, it contains the data requested by the second CPU. The DRAM will generate a NACK signal and fetch the requested data from main memory into cache, again replacing the data requested by the second CPU with the data requested by the first CPU. When the second CPU resubmits its read request package, the process is repeated. The DRAM and CPU's are thus caught in an endless loop of sending read request and fetching data into cache. Such a loop is commonly referred to as "livelock".

A similar problem exists if a CPU request is submitted during a refresh cycle of a DRAM with cache. When the DRAM is in a refresh cycle, the refresh controller stores the contents of the memory cells that are to be refreshed into cache. After a row of data is refreshed, the contents of the cache are reloaded back into main memory. If the CPU provides a request during the refresh cycle, the DRAM will cause the CPU request data to be transferred into cache, replacing the refresh data already within the cache. When the refresh controller places the data from cache back into the main memory, the refreshed memory cells will contain invalid data.

One possible solution is the incorporation of a timer that is connected to the cache and main memory block. Once a cache fetch from main memory is initiated, the timer prevents further cache fetches until a predetermined time has elapsed. Thus in the example above, when the first CPU provides a read request that is subsequently fetched from main memory into cache, the submission of a read request from the second CPU will not cause a cache fetch of the new data request, unless a predetermined time has elapsed since the first request. The timer is typically set to allow the first master to resubmit the read request before time has expired. The use of a timer is somewhat limiting, in that the speed of the CPU must be known and within the limits of the timer. The timer concept is also less susceptible to modifications in the CPU and bus protocol.

SUMMARY OF THE INVENTION

The present invention is a method and apparatus for allowing two or more masters to read a dynamic random access memory (DRAM) device which includes a cache. When a CPU provides a read/write request, the DRAM has a first logic circuit that compares addresses requested with addresses stored in the cache. If the addresses are the same (a "hit"), the DRAM sends an acknowledge (ACK) signal to that CPU and sends the data to the processor. If the addresses are not the same, the DRAM sends a no acknowledge (NACK) signal to the CPU and transfers the requested data from the main memory block to cache.

The DRAM has a second logic circuit that contains a latch which is set when the DRAM sends a NACK signal and reset when the DRAM sends a subsequent ACK signal. The second circuit is connected to the first logic circuit to disable the first logic circuit and prevent a cache fetch from main memory when the latch has been set. When a first CPU requests addresses that are not in cache, the DRAM will send a NACK signal which will set the latch. Any subsequent CPU request that is not contained in cache will cause a NACK signal to be generated and the first logic circuit will be prevented from initiating a cache fetch from main memory. When the original request is resubmitted, the CPU is allowed to access the DRAM cache. The DRAM also sends out an ACK signal, which resets the latch, and allows subsequent CPU requests to initiate a cache fetch. The second logic circuit is also connected to a refresh controller to prevent a refresh cycle until the CPU is provided with the initially requested data.

Therefore it is an object of this invention to provide a method and apparatus that allows two or more masters to read from a DRAM with cache.

It is also an object of this invention to provide a DRAM with cache that allows a refresh controller to use the cache to temporarily store data during the refresh cycle.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
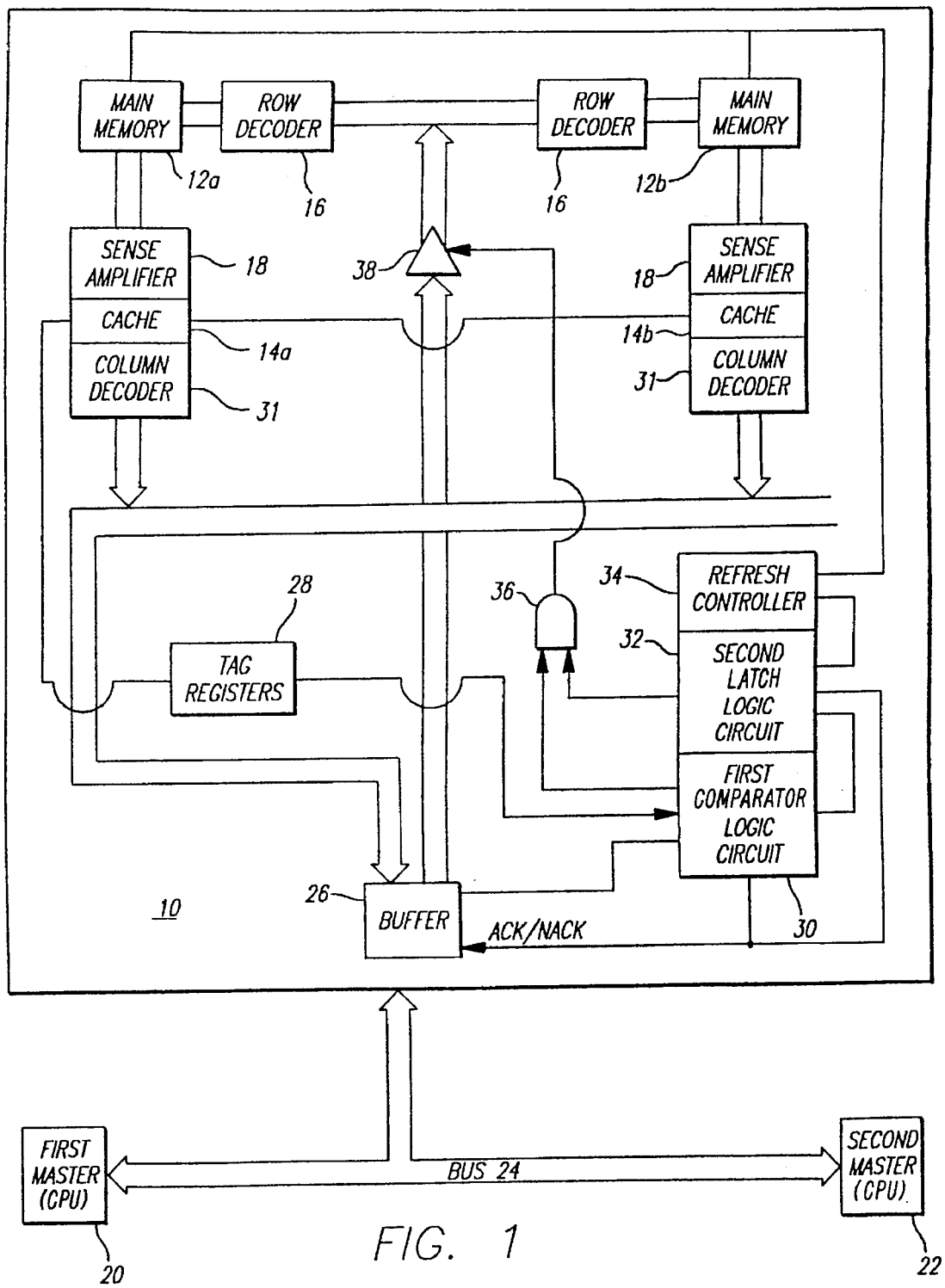
FIG. 1 is a schematic of a memory device of the present invention connected to two masters.

Referring to the drawings more particularly by reference numbers, FIG. 1 shows a schematic of a memory device 10 of the present invention. The memory device 10 is preferably a a dynamic random access memory (DRAM) device. Such a device is preferred because of the high speed and large memory capacity of DRAM chips. Although the present invention is described with DRAM technology, it is to be understood that other memory devices such as static random access memory (SRAM) can be utilized with the present invention.

In the preferred embodiment, the memory device 10 has two main blocks of memory 12a and 12b, each containing memory cells organized into a 36×256×256 array. Each block has a cache 14a and 14b which can store a row of data from main memory. Data is stored in cache by sending the requested address to the row decoders 16 which enable one of the 256 rows of the main memory blocks 12. The outputs of the main memory sense amplifiers 18 are latched and stored into the cache lines. Each cache therefore stores approximately 1K byte of data. Such a device is sold by Rambus, Inc. of Mountain View, Calif.

The memory device 10 is typically coupled to a first master 20 and a second master 22 by a bus 24. The masters are typically central processing units (CPUs), but may also include other devices such as graphic controllers. Although two masters are shown and described, it is to be understood that the present invention may be employed with more than two masters. The data bus 24 is preferably 1 byte wide and has a data rate of 500 Mbytes/sec. The memory device 10 may have a buffer 26 that allows the device 10 to communicate with the byte wide bus 24. The buffer 26 reads data from cache, 72 bits per cycle (8 bytes plus a horizontal parity bit for each byte, for a total of 72 bits). The buffer 26 then transfers the data onto the bus 1 byte (plus the parity bits) each bus clock cycle (2 nanoseconds). CPU's will typically read in 16 byte bursts, wherein the buffer 26 reads two 8 byte blocks of data from the cache every 16 nanoseconds and transfers 16 bytes of data onto the bus every 2 nanoseconds. The DRAM 10 also has tag registers 28 that store the addresses of the data within cache. Connected to the tag registers 28 and main memory is a first logic circuit 30.

To initiate a memory request, the CPU (or a CPU interface) will send a request package that contains a read or write request. The request package contains the addresses to be read (or written), information regarding the function to be performed (read or write), the number of data bytes to be transferred and a coded signal containing the device identification (ID). Typically there will be multiple DRAM's in a system, wherein each DRAM will have an associated id.

When a CPU sends a read request package, the first logic circuit 30 compares the addresses in the request package with the addresses stored in the tag registers 28 to determine if the requested data is in cache. (The first logic circuit 30 also compares the device ID in the request package with the device id stored in an internal id register). If the cache 14 contains the requested data, the first logic circuit 30 sends an ACK signal back to the CPU. The requested addresses are sent to the column decoder 31 of the cache 14, so that the data can be latched by the buffer 26. The buffer 26 then sends the data onto the bus 24.

If the cache does not have the requested data, the first logic circuit 30 will send a NACK signal to the CPU. The requested addresses are sent to the row decoders 16 which enable a row within main memory. The data is then latched from the sense amplifiers 18 into cache 14. The cache now contains the data requested in the original read request package. The CPU then resubmits the same read request which is now stored within cache.

CPU write requests are performed in a similar manner. If the DRAM cache does not have the addresses within the request package, the DRAM provides a NACK signal and performs a cache fetch. The request package is then resubmitted and the data is written into cache. Attached to the first logic circuit 30 is a second logic circuit 32. The second logic circuit 32 can be a latch connected to the ACK/NACK response line of the first logic circuit 30. The output of the latch 32 is also connected to the refresh control circuit 34 of the DRAM. The refresh controller 34 periodically refreshes the memory cells of the DRAM, as is known in the art. While refreshing the memory cells, the refresh control circuit typically stores a row of data from main memory into cache. When the cells are refreshed, the controller transfers the data from cache back into main memory.

When the first circuit 30 sends out a NACK signal, the latch is SET. When the latch (second logic circuit) 32 is SET, the refresh control logic 34 is disabled so that the controller 34 cannot initiate a refresh cycle in the DRAM. The latch 32 remains SET until the first logic circuit 30 sends out an ACK signal which causes the latch to RESET. When the latch 32 is RESET, the refresh control circuit 34 is enabled and can initiate a refresh cycle.

In operation, a CPU generates a request package that contains addresses. The request package may contain a read or write request. The first logic circuit 30 determines if the requested data is in cache 14. If the requested addresses are not in cache 14, the first logic circuit 30 provides a NACK signal, which SETS the latch 32 and disables the refresh control circuit 34. The main memory 12 decodes the requested addresses and loads the data into cache 14. When the CPU resubmits the request package, the first logic circuit 30 sends an ACK signal, which RESETS the latch 32 and enables the refresh control circuit 34. The CPU then either reads or writes the data from cache 14. The second logic circuit 32 therefore prevents a refresh cycle from being initiated until the CPU has successfully read the requested data.

The second logic circuit 32 can also be connected to the first logic circuit 30 so that the first logic circuit 30 does not initiate a cache fetch from main memory 12 when the latch 32 is SET, and allows a cache fetch when the latch 32 is RESET. In the preferred embodiment, the latch 32 is connected to an AND gate 36 which has an output connected to a tristate buffer 38. When the AND gate 36 outputs a binary 1, the tristate buffer 38 is disabled, disconnecting the row decoders 14 from the first logic circuit 30, so that the requested address cannot be sent to the decoders to initiate a cache fetch. When the AND gate 36 provides a binary 0 output, the tristate buffer 38 is enabled allowing a cache fetch to be performed. The first logic circuit 30 typically contains an internal timer (not shown) that provides an output (binary 1) after a cache fetch has been completed. The timer output is also connected to the AND gate 36.

When a cache "miss" has occurred, the first logic circuit 30 generates a NACK signal and sends the requested addresses to the row decoders 14 to initiate a cache fetch. The latch 32 is SET which provides a binary 1 to the AND gate 36. After the data has been fetched from main memory 12 into cache 14, the timer expires and provides a binary 1 to the AND gate 36, which disables the tristate buffer 38 and prevents any further cache fetches. When the CPU resubmits a request package, the first logic circuit 30 sends an ACK signal. The ACK signal RESETs the latch 32 and enables the tristate buffer 38 so that subsequent cache fetches can be initiated. This embodiment prevents live-lock from occurring between two CPU's that are both trying to read or write to different addresses within the DRAM.

For example, when the first CPU 20 sends a request package to the DRAM 10, the first logic circuit 30 compares the requested addresses with the addresses in the tag registers 28 to determine if the cache 14 contains the data. If the requested data is not within cache, the first logic circuit 30 sends a NACK signal and sends the addresses to the row decoders 14, wherein the data is loaded into cache 14. The latch 32 is also SET, disabling the tristate buffer 38 and preventing any subsequent cache fetches (the refresh controller is also disabled). Before the first CPU 20 resubmits the first request package, a second CPU 22 may send a second request package that contains requested addresses. If the cache contains the requested addresses, the first logic circuit 30 will send an ACK signal to the second CPU 22. The data is then retrieved from cache and sent to the second CPU 22. The ACK signal also RESETs the latch 32 and enables the tristate buffer 38. When the first CPU 20 resubmits the first request package, the cache 14 will still contain the requested addresses which can be accessed by the first CPU 20.

If the cache does not contain the addresses requested by the second CPU 22, the first logic circuit 30 will send a NACK signal to the second CPU 22. Because the tristate buffer 38 is disabled (by the first NACK signal), the row decoders 14 cannot read the addresses requested by the second CPU 22. The data requested by the first CPU 20 remains in cache, so that when the first CPU 20 resubmits the first request package, the data is waiting. The resubmitted request package causes the first logic circuit 30 to send an ACK signal, which RESETS the latch 32 and enables the tristate buffer 38. When the second CPU 22 resubmits the second request package, the first logic circuit 30 will send a NACK signal and the requested data is transferred into cache 14. The tristate buffer 38 is again disabled, wherein the data requested by the second CPU 22 will remain in cache 14 until the second request package is resubmitted. The second logic circuit 32 therefore allows two CPU's (masters) to read from a DRAM that contains cache memory.

As an alternate embodiment, the CPU's may send coded signals which are indicative of the CPU requesting data. The coded signal may be contained within the read request package. For example, when just two CPU's are connected to the DRAM, the code may be a single bit that is either a binary 1 or 0. The first CPU 20 will always send a binary 0 with a request package, which indicates that the request originated from the first CPU 20. Likewise, the second CPU 20 will always send a binary 1 with the request package, which indicates that the request originated from the second CPU 22. The second logic circuit 32 may have storage means to store the coded signal. The second logic circuit 32 will then enable and disable the tristate buffer 38 and refresh controller 34 in accordance with the receipt of the coded signal.

For example, when the first CPU 20 sends a request package, the binary 0 is stored in the second logic circuit 32. If the requested data is not within cache 14, the first logic circuit 30 sends the NACK signal, which disables the tristate buffer 38 and the refresh controller 34. The second logic circuit 32 maintains the tristate buffer 38 and refresh controller 34 in the disabled condition, until the first coded signal (binary 0) is resubmitted to the DRAM. Thus, if a second CPU 22 sends a request package that contains a coded signal with a binary 1, the second logic circuit maintains the tristate buffer 38 and refresh controller 34 in the disabled conditions, preventing a second cache fetch. In the alternative, the second logic circuit 32 may store the last address in the request package and maintain the tristate buffer 38 and refresh controller 34 in the disabled state until the stored address is resubmitted. Although the second logic 32 circuit has been shown connected to both the tristate buffer 38 and refresh control circuit 34, it is to be understood that the second logic circuit 32 can be connected to either the tristate buffer 38 or the refresh controller 34.

While certain exemplary embodiments have been described in detail and shown in the accompanying drawings, it is to be understood that such embodiments are merely illustrative, and not restrictive, of the broad invention, and that this invention is not limited to the specific constructions and arrangements shown and described, since various other modifications may occur to those of ordinary skill in the art.

What is claimed is:

1. A memory device that is coupled to a master device which provides a first request package that has a first request address, comprising:

a main memory block;

a cache that is connected to said main memory block and has a cache address;

a first logic circuit that is connected to said cache and said main memory block and which compares said first request address with said cache address, and performs a first cache fetch such that data associated with said first request address is transferred from said main memory block to said cache when said cache does not contain the first request address, wherein said first logic circuit provides an acknowledge (ACK) signal when said cache contains said first request address and provides a no acknowledge (NACK) signal when said cache does not contain said first request address; and, a latching logic circuit connected to said main memory block and said first logic circuit, said latching logic circuit being set and preventing a second cache fetch when said cache does not contain the first request address and the NACK signal is provided, and is reset and allows the second cache fetch when said cache contains the first request address and the ACK signal is provided when the first request package is resubmitted.

2. The memory device as recited in claim 1, further comprising a refresh controller that refreshes said main memory block, said refresh controller being connected to said latching logic circuit such that said refresh controller is disabled until the first request package is resubmitted by the master device.

3. A computer system, comprising:

a main memory block;

a refresh controller that performs a refresh operation on said main memory block;

a cache that is connected to said main memory block and has a cache address;

a data bus connected to said cache;

a first master device connected to said data bus for generating a first request package that contains a first request address;

a second master device connected to said data bus for generating a second request package that contains a second request address;

a first logic circuit that is connected to said cache, said main memory block and said data bus and which compares said first request address with said cache address, and performs a first cache fetch such that data associated with said first request address is transferred from said main memory block to said cache when said cache does not contain the first request address, wherein said first logic circuit provides an acknowledge (ACK) signal when said cache contains said first request address and provides a no acknowledge (NACK) signal when said cache does not contain said first request address; and, a latching logic circuit connected to said main memory block, said first logic circuit and said refresh controller, said latching logic circuit being set and preventing both the refresh operation and a second cache fetch when said cache does not contain the first request address and the NACK signal is provided, and is reset and allows both the refresh operation and the second cache fetch when said cache contains the first request address and the ACK signal is provided when the first request package is resubmitted.

4. The system as recited in claim 3, wherein said first and second master devices are each a central processing unit (CPU).

5. The system as recited in claim 4, wherein said first request package includes a coded signal which is indicative of one of said first and second master devices, said latching logic circuit stores said coded signal and disables said main memory block and said refresh controller until said coded signal is resubmitted.

6. The system as recited in claim 5, wherein said coded signal is said first request address.

7. The system as recited in claim 5, wherein the coded signal for said first master device is a binary 0 and the coded signal for said second master device is a binary 1.

* * * * *